US010429463B2

(12) United States Patent
Wheaton

(10) Patent No.: US 10,429,463 B2
(45) Date of Patent: Oct. 1, 2019

(54) QUIET MRI WITH SPIN ECHO (SE) OR FAST SPIN ECHO (FSE)

(71) Applicant: Toshiba Medical Systems Corporation, Otawara-shi (JP)

(72) Inventor: Andrew J. Wheaton, Vernon Hills, IL (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 543 days.

(21) Appl. No.: 15/180,761

(22) Filed: Jun. 13, 2016

(65) Prior Publication Data
US 2017/0356973 A1 Dec. 14, 2017

(51) Int. Cl.
G01R 33/385 (2006.01)
G01R 33/48 (2006.01)
G01R 33/561 (2006.01)
G01R 33/483 (2006.01)

(52) U.S. Cl.
CPC ..... *G01R 33/3854* (2013.01); *G01R 33/4822* (2013.01); *G01R 33/4826* (2013.01); *G01R 33/4833* (2013.01); *G01R 33/5617* (2013.01)

(58) Field of Classification Search
CPC ............ G01R 33/3854; G01R 33/4822; G01R 33/4833; G01R 33/5617; G01R 33/4826
See application file for complete search history.

(56) References Cited

U.S. PATENT DOCUMENTS

| 6,937,014 | B2 * | 8/2005 | Sun ....................... G01N 24/081 324/300 |
| 7,071,690 | B2 | 7/2006 | Butts et al. |
| 8,228,062 | B2 * | 7/2012 | Sharp ................. G01R 33/3415 324/309 |
| 9,507,002 | B2 * | 11/2016 | Popescu ................. G01R 33/56 |
| 2004/0064032 | A1 * | 4/2004 | Ma ...................... G01R 33/4828 600/410 |
| 2006/0109004 | A1 * | 5/2006 | Butts ................ G01R 33/56563 324/307 |
| 2009/0169084 | A1 * | 7/2009 | Li ....................... G01R 33/4824 382/131 |
| 2009/0179643 | A1 * | 7/2009 | Lin ................... G01R 33/34084 324/312 |
| 2010/0026299 | A1 * | 2/2010 | King ................. G01R 33/3415 324/309 |
| 2011/0279117 | A1 * | 11/2011 | Alford ................. A61K 49/103 324/307 |

(Continued)

OTHER PUBLICATIONS

Butts, K., et al., "Reduction of Blurring in View Angle Tilting MRI," Magnetic Resonance in Medicine 53:418-424 (2005).

(Continued)

*Primary Examiner* — Dixomara Vargas
*Assistant Examiner* — Zannatul Ferdous
(74) *Attorney, Agent, or Firm* — Nixon & Vanderhye, P.C.

(57) ABSTRACT

Magnetic resonance imaging (MRI) systems and methods to effect MRI data acquisition with reduced noise in fast spin echo (FSE) and spin echo (SE) implementations are described. The improved MRI data acquisition is performed by acquiring k-space data while maintaining a constant or near constant slice select gradient amplitude throughout a sequence kernel. The acquired k-space data can then be used to generate an MR image.

20 Claims, 6 Drawing Sheets

(56) References Cited

U.S. PATENT DOCUMENTS

2014/0097840 A1    4/2014  Grodzki

OTHER PUBLICATIONS

Cho, Z., et al., "Total inhomogeneity correction including chemical shifts and susceptibility by view angle tilting," Medical Physics 15, 7 (1988).
Grodzki, D., et al., "Ultrashort Echo Time Imaging Using Pointwise Encoding Time Reduction With Radial Acquisition (PETRA)," Magnetic Resonance in Medicine 67:510-518 (2012).
Heismann, B., et al., "Sequence-Based Acoustic Noise Reduction of Clinical MRI Scans," Magnetic Resonance in Medicine 73:1104-1109 (2015).
Hennel, F., et al., "Fast Spin Echol and Fast Gradient Echo MRI With Low Acoustic Noise," Journal of Magnetic Resonance Imaging, 13:960-966 (2001).
Hennel, F., et al., "'Silent' MRI With Soft Gradient Pulses," Magnetic Resonance in Medicine 42:6-10 (1999).
Ida, M., et al., "Quiet T1-Weighted Imaging Using PETRA: Initial Clinical Evaluation in Intracranial Tumor Patients," Journal of Magnetic Resonance Imaging 41:447-453 (2015).
Kuethe, D., et al., "Imaging Lungs Using Inert Fluorinated Gases," Magnetic Resonance in Medicine 39:85-88 (1998).
Madio, D., et al., "Ultra-Fast Imaging Using Low Flip Angles and FIDs," Magnetic Resonance in Medicine 34:525-529 (1995).
Oshio, K., "Whole heart coronary angiography using self-navigated "paddle-wheel" balanced SSFP," Proc. Intl. Soc. Mag. Reson. Med. 13 (2005).
Segbers, M., et al., "Shaping and Timing Gradient Pulses to Reduce MRI Acoustic Noise," Magnetic Resonance in Medicine 64:546-553 (2010).

\* cited by examiner

| Orientation | PE dir. | RO | PE | SS | Noise Standard / Embodiments (dB) |
|---|---|---|---|---|---|
| AX | RL | Y | X | Z | 102 / 94 |
| AX | AP | X | Y | Z | 103 / 88 |
| SG | HF | Y | Z | X | 95 / 93 |
| SG | AP | Z | Y | X | 103 / 94 |
| CO | HF | Z | X | Y | 94 / 89 |
| CO | RL | X | Z | Y | 104 / 94 |

QUIET MRI WITH SPIN ECHO (SE) OR FAST SPIN ECHO (FSE)

FIELD

The subject matter below relates generally to magnetic resonance imaging (MRI) with reduced acoustic noise, and more particularly to systems and methods for MRI imaging with Spin Echo (SE) or Fast Spin Echo (FSE).

BRIEF DESCRIPTION OF THE DRAWINGS

FIG. 5 illustrates a table showing noise reduction that can be achieved for various arrangements according to some embodiments.

DETAILED DESCRIPTION

Figure 1:
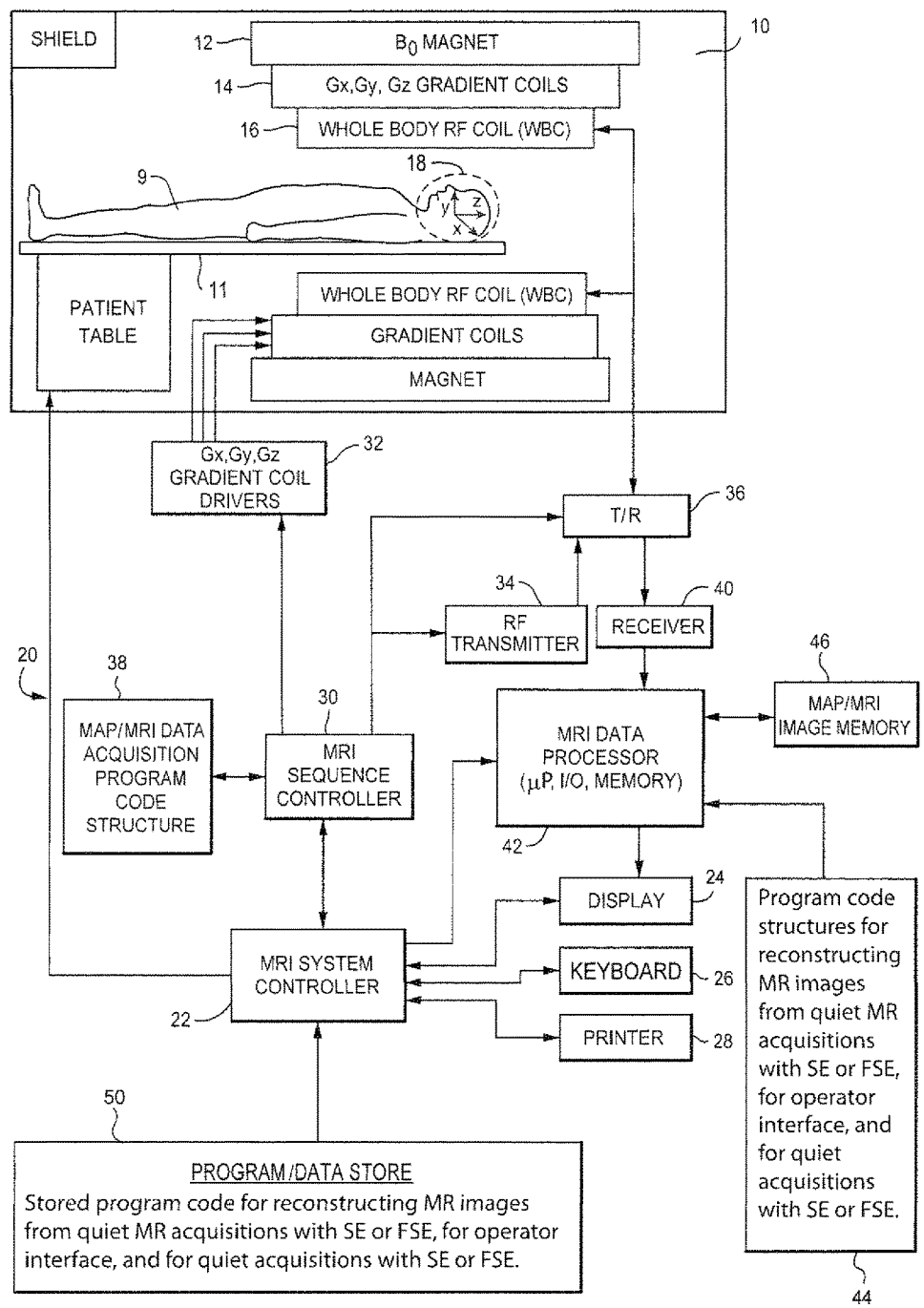
FIG. 1 is a high-level schematic block diagram of an MRI system adapted for reducing acoustic noise generated during MRI scanning with Spin Echo (SE) or Fast Spin Echo (FSE) in accordance with one or more embodiments.

Current MRI scanners may produce a high level of acoustic noise during scanning. While acoustic noise levels about 90-100 dBA are typical in many conventional MRI systems, the noise levels can often reach higher than 130 dBA. Comparing these levels with the noise level of a rock concert at 110 dBA or a jackhammer at 100 dBA, one can appreciate the excessiveness of such noise levels in a medical application. High levels of noise during the MRI scanning process is undesirable because it can lead to discomfort for the patient and patient complaints. Excessive noise is particularly undesirable in pediatric clinical applications and applications for the elderly.

The noise is primarily due to current provided to gradient magnetic field coils for spatial encoding and readout during MRI data acquisition sequences ("scanning"). More specifically, as described in Hennel et al., "'Silent' MRI Soft Gradient Pulses", Magnetic Resonance in Medicine, 42:6-10, 1999, this "scanner noise" is produced by vibrations in the gradient coil related structures due to induced Lorentz forces which are proportional to the product of magnetic field strength and the gradient of amplitude changes (e.g., slew rate). Such "scanner noise" is sometimes referred to in this document as "acoustic noise" or simply as "noise" where the meaning is sufficiently clear.

Earlier attempts to reduce MRI scanning noise have reduced sound pressure by using a vacuum chamber to surround the gradient coil(s). More recently some products also use MRI data acquisition sequence optimizations for reducing noise.

Some conventional MR data acquisition sequence optimizations for reduced noise use long duration gradient transitions and short duration sampling bandwidth. Other conventional techniques include the use of low-pass filtered or sinusoidal gradient transitions etc. Such conventional techniques do provide a partial reduction in acoustic noise. Although these techniques often result in low rate of change (i.e., dG/dt, "slew rate") of the gradient amplitude, they may not result in a reduction in the number of gradient transitions per repetition interval (TR). For example, comparison of a conventional pulse sequence and a corresponding prior reduced noise pulse sequence illustrates that the number of gradient transitions remain substantially the same, although for some transitions the dG/dt (slew rate) is lower, and hence the level of noise is reduced.

In some prior arrangements for a Zero Echo Time (ZTE) technique, a gradient transition may be performed before transmission of an RF excitation pulse and then held constant throughout the acquisition of MR data, thus reducing the number and amplitude of gradient transitions. In typical ZTE, an RF excitation pulse is transmitted after the Gx, Gy, Gz gradients have been fully activated (e.g., fully ramped) for an initially acquired portion of k-space, MRI data is initially acquired in a radial pattern but not including a central area of k-space including the k-space center. Immediate data collection (e.g., with TE of near zero), is limited by how quickly the RF pulse transmitter can be turned off and how quickly the RF receiver can be turned on. Due to these limitations, which result in a delay of about 100 microseconds between the times of RF pulse transmission and the start of MRI data collection, an area including the k-space center is not sampled when sampling k-space for the spokes of this type of radial acquisition. To fill in the missing k-space center area, data are either estimated algebraically, or subsequently acquired using a second radial acquisition with a reduced gradient amplitude, or a second acquisition using a point-wise Cartesian scanning pattern. Thus, although the resulting noise level can be substantially reduced during the initial radial data acquisition phase, because each gradient transition is small, the subsequent separate Cartesian-patterned filling of missing points in the center of k-space can cause additional, or at least inconsistent, noise.

Moreover, ZTE techniques lose at least some ability for motion correction in reconstructed images because they separately acquire the k-center region and the region outside the k-center region. Not having the k-space center, which yields information for the entire image, in each acquisition reduces motion correction capability. For example, because, the radial and Cartesian data sub-sets are acquired at different times and also because of the need for interpolation when combining radial with Cartesian data sub-sets, such combination of differently organized data can lead to data mismatches, possibly imperfectly resolved so as to leave image artifacts. Even further, some prior techniques are limited to half-echo (e.g., lower sampling frequencies and/or shorter echo times) projection acquisition (e.g., because, without pre-winder, data acquisition may be limited to starting from zero for each spoke of radial acquisition), and an increased number of projections (e.g., TR intervals) are required to obtain full coverage of k-space. There may also be an added disadvantage of inconsistent acoustic noise because while the radial part of the acquisition may be relatively quiet, the Cartesian part is louder. Inconsistent noise levels also may be unsettling to the patient being scanned.

ZTE methods are only capable of providing proton density (PD) weighted image contrast. The ZTE techniques, which require data acquisition immediately following RF excitation, are not compatible with other frequently applied sequences for T2-weighting such as spin echo (SE) or fast spin echo (FSE), which require data acquisition following an RF echo. While ZTE-based methods can be combined with an inversion recovery (IR) prepulse or T2-weighted prepulse to add T1 or T2 image contrast, respectively, the extra T1 or T2 contrast comes at the cost of scan time, signal-to-noise, or both.

Thus, there is a need to achieve quiet T2-weighted imaging apart from the ZTE-based family of methods. Conventional methods of acoustic noise reduction for T2 sequences, such as SE and FSE, include using longer ramps, non-linear waveforms, etc. These acoustic noise reduction methods have shown a reduction of noise generated by FSE only by about 10 dB.

Example embodiments of the subject matter disclosed herein provide for MRI scanning with substantially reduced noise for SE and FSE sequences. In example embodiments, k-space is sampled by executing pulse sequences configured such that the number of gradient transitions is reduced, which in turn results in a substantial noise reduction. In particular, example embodiments reduce slice selection gradient transitions in SE and FSE sequences by maintaining substantially the same slice selection gradient during a data acquisition phase during the excitation phase of each repeating kernel of the sequence.

FSE is used in numerous applications, including, for example, the View Angle Tilting (VAT) technique used for imaging in situations where metal objects or the like can be present in the examined object. VAT is described in Cho et al, "Total Inhomogeneity Correction Including Chemical Shifts and Susceptibility by View Angle Tilting", Medical Physics 1988, 15:7-11, and also in U.S. Pat. No. 7,071,690 to Butts et al. Metal objects and the like can distort spins such that the resulting image loses clarity. VAT is based on applying the slice select gradient during readout (in addition to it being applied, as usual, during RF excitation) in order to refocus distorted spins in the readout window. In VAT, the same slice select gradient applied during RF excitation is also applied during the corresponding readout, to obtain a "tilt" of voxels in the slice direction by an angle θ where tan $\theta=G_{SS}/G_{RO}$, $G_{SS}$ being the slice select gradient and the $G_{RO}$ being the readout gradient. That is, VAT "tilts" the view angle in the two dimensional plane formed by the axis corresponding to $G_{SS}$ and $G_{RO}$ by θ. The size of the angle depends upon the slice select gradient, and the slice select gradient is dependent upon bandwidth and the shape of the RF pulses. The refocusing can, at least in some cases, resolve all readout distortion. However, conventional VAT generates a substantial amount of noise because the number and amplitude of gradient transitions remains the approximately the same as a conventional sequence.

Example embodiments provide for susceptibility artifact reduction for foreign objects such as, for example, metal, by scanning with an FSE or SE sequence adapted to maintain the slice select gradient constant or substantially constant during the data acquisition phase of a sequence kernel. In some embodiments, in addition to maintaining the slice select gradient constant or substantially constant during the data acquisition phase, other acoustic reduction techniques such as, but not limited to, increasing gradient ramp durations, reshaping gradient waveforms (e.g., sinusoid, Hamming, etc.) and like techniques may be employed to further reduce acoustic noise. Segbers et al., "Shaping and Timing Gradient Pulses to Reduce MRI Acoustic Noise", Magnetic Resonance in Medicine 64:546-553 (2010), describes several techniques that may be used in embodiments for shaping of pulses and timing of gradients in order to reduce noise. Tests demonstrate that maintaining the slice selection gradient constant in combination with techniques such as longer ramps (e.g., 1-2 ms duration ramps) for gradient transitions yields a greater reduction in acoustic noise than techniques that implement only approaches such as extended ramp durations. Acoustic noise reduction according to some embodiments can achieve a noise level as low as about 8 dB above background in a 3T scanner.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest (i.e., region of interest or "ROI") for a patient 9 supported by a patient table 11.

In some embodiments, a smaller array RF coil (not shown) might be coupled to a portion of the patient such that the imaging volume would include the area encompassed by the smaller array RF coil. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils may herein be referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice message produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coils. A duty cycle or repetition interval (TR) is also controlled by the system controller 22 and/or sequence controller 30. The transmission of pulse sequences, duty cycle etc. may be controlled by the MRI system controller 22, MRI sequence controller 30, and/or MRI data processor 42 based on, for example, program code for a signal acquisition pattern such as, for example, spin echo or fast spin echo as described in relation to FIG. 2.

The MRI system 20 includes an RF receiver 40 providing input to data processor 42 so as to create processed image data, which is sent to display 24. The MRI data processor 42 is also configured for access to system configuration parameters 46, program code structures 44 and program/data store 50. MRI program code structures 44 and 50 may, in addition to control logic for reconstructing MRI images, also include control logic to obtain MR data with reduces acoustic noise from gradient coils 14. Processes such as, for example, processes 300 and 400 described below in relation to FIGS. 3 and 4, respectively, can be performed by the MRI system controller 22, MRI sequence controller 30, and/or MRI data processor 42.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for controlling reduced acoustic noise data acquisition according to SE and FSE scan techniques, for improved image reconstruction of SE and FSE acquisitions, for defining graphical user interfaces (GUI), accepting operator inputs), and configured or predetermined data (e.g., certain threshold settings for controlling program execution, parameters for controlling noise reduced MR data acquisition and subsequent MR image reconstruction) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments described herein. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

Figure 2:
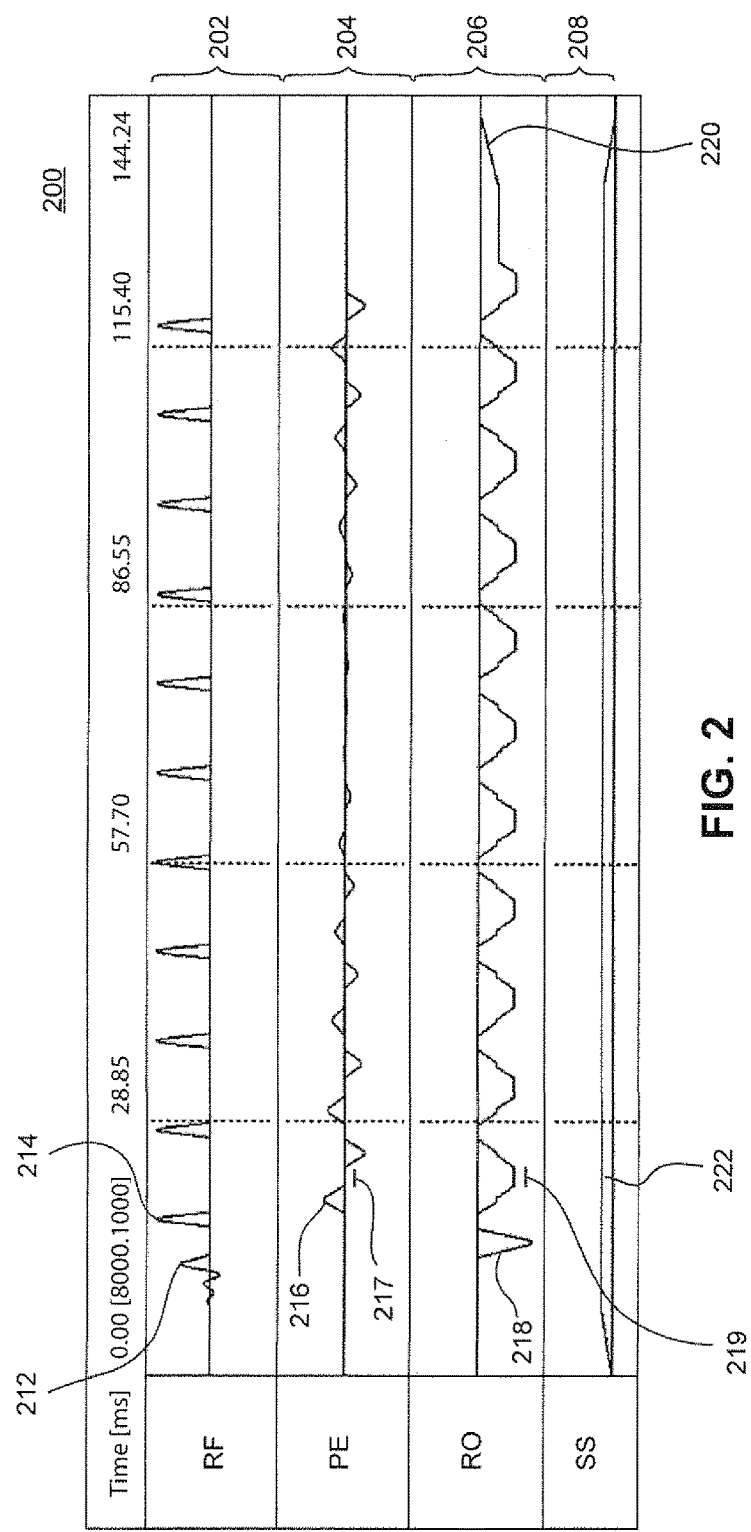
FIG. 2 illustrates a portion of an example MRI data acquisition sequence, according to some example embodiments.

FIG. 2 illustrates a MR data acquisition pattern 200 according to some example embodiments over a single TR interval (e.g., a sequence "kernel" that is repeated each TR interval albeit using slightly different spatial encoding from one TR interval to another). The data acquisition pattern 200 represents a single "shot" or the acquisition of several lines of k-space within a single TR interval. The sequence 202 is a fast spin echo (FSE) sequence of an excitation RF pulse (e.g., 90 degree excitation pulse) 212 followed by a plurality of refocus pulses (e.g., 180 degree refocus pulses) 214 as used in example embodiments. A free induction decay (FID) results immediately after the excitation pulse. An RF echo (not shown), which is read/sampled by the MRI system by setting appropriate gradients, is generated after each refocus pulse. The illustrated sequence 202 of a an excitation pulse followed by 11 refocus pulses results in echoes for filling up 11 lines of a k-space in each TR interval. The illustrated portion of sequence 202 is an example of a "kernel" of an FSE sequence which repeats each TR until sufficient MR data has been collected for filling k-space. In contrast to FSE, a spin echo (SE) sequence (not shown) comprises an excitation RF pulse followed by a single refocus pulse, resulting in filling up one line of k-space in each TR interval.

The phase encode gradient (e.g., Gy) waveform 204 illustrates balanced gradients 216 that alternate from a positive polarity gradient to a negative polarity gradient and vice versa winding and then rewinding each sampled spin echo. Pairs of phase encoding gradients have equal but opposite polarity amplitudes resulting in a balanced first order gradient moment. Each successive pair of equal but opposite polarity gradients have different amplitudes in order to encode different rows in k-space. The reading of the RF echo (not shown) occurs during the period of zero phase encode gradient 217. The amplitude of the pairs of phase encode gradients decrease from beginning towards the middle portion of the kernel and, after a minimum amplitude gradients pair, gradually increase from the midpoint of the kernel to the end. The strongest echo in the echo train is detected at or near the midpoint of the kernel, as shown by the nearly zero amplitude of the alternating gradients in the middle. The strongest echo corresponds to a middle row of the k-space populated using the sequence. Thus, in some embodiments, the echoes from the refocus pulses going from left to right in FIG. 2, are used to encode k-space lines from bottom to top of a k-space segment.

The readout gradient (e.g., Gx) waveform 206 begins with a prewinder 218 and then repeatedly decreases and increases with gradients 219 at the lowest gradient for echo sampling. The prewinder gradient 218 causes the encoding to, after reaching the right edge of a k-space line, return to the left edge of the next k-space line to be encoded. At the end of the sequence of repeated decreases and increases of the phase encode gradient, a slower tapering 220 towards zero occurs. The tapering 220 may be an end spoiler to dephase any remaining magnetization. In the embodiment shown, the phase encode gradient is a negative polarity gradient.

The slice selection gradient waveform 208 illustrates this gradient increasing to the desired amplitude value 222 prior to the occurrence of the RF excitation pulse 212 and remaining substantially at the same value throughout the sequence of refocus pulses 214. The amplitude value 222 provides a "crusher" which dephases the signal from the FID following each RF refocus pulse. In SE and FSE, the echoes of interest (i.e., echoes collected as MR data) are those formed by the echo of the excitation pulse and each of the refocus pulses. In some embodiments, however, amplitude 222 may not be selected to completely "crush" the FID.

At the beginning of the kernel, the slice select gradient may be slowly ramped up to the desired amplitude. The slice select gradient is at the desired amplitude before the RF excitation pulse is transmitted. At the end of the kernel the slice select gradient transitions back to zero. The transition to zero also may be a slow transition. Thus, the slice selection gradient at most makes one transition at the beginning of a kernel before an RF excitation pulse is transmitted (i.e., radiated) and maintains substantially the same value without any transitions for the duration of the kernel.

In some embodiments, the slice select gradient remains constant at the same amplitude. In some embodiments, depending on various reasons, the slice select gradient may differ by relatively small or insignificant amounts (e.g., plus or minus 10% from beginning to end of the kernel) throughout the kernel without significantly affecting the reduction of noise. Such insubstantial changes in the slice selection gradient may be necessary, for example, in order to accommodate the balancing of gradients and/or echo spacing requirements in FSE. As an example of a small difference in slice selection gradient, if the selection bandwidth of the excitation and refocus RF pulses are not substantially equivalent, the slice selection gradient amplitude applied during the refocus RF pulse would need to be different than the amplitude during the excitation RF pulses. In practice, to minimize this difference, the sequence designer aims to substantially balance the selection bandwidths of these two RF pulses.

However, embodiments typically may maintain the amplitude of the slice selection gradient sufficiently constant to reduce acoustic noise by at least 6 dB compared to acoustic noise generated by an MRI data acquisition sequence wherein the slice selection gradient transitions to substantially zero amplitude between MR echo data acquisition readout periods The pattern 200 shown in FIG. 2 is for 2D FSE. However, FSE can also be applied to obtain 3D MR images. 3D FSE basically requires that successively incremented phase encoding gradients be applied in the z-direction in addition to being applied in the y-direction. In 3D FSE a phase encode gradient is typically applied after each refocus pulse, and in addition, a phase re-winder gradient is typically applied after the sampling of the corresponding echo of that refocus pulse.

Thus, several configurable parameters may determine the application of SE or FSE in embodiments. Angles and amplitudes of the excite and refocus pulses, and the spacing between refocus pulses may be configured for desired effects. The RF excite pulses typically have a 90 NMR spin nutation degree angle, and the RF refocus pulses typically have a 180 degree NMR spin nutation angle. However, these angles may be different for various reasons, such as, for example, reduction of RF energy deposited into the patient and/or hardware, RF amplifier hardware limitations, transmit RF coil limitations, etc. The echo spacing may be configured to achieve optimum echo spacing or improved crusher moment on the slice select axis.

The illustrated example produces 11 echoes per kernel. However, in various embodiments, each kernel may produce a number of echoes ranging from 1 (SE) up to 300 (i.e. for single shot FSE).

In example embodiments, the primary gradient transition also can be configured to be of relatively long duration so that the slew rate is reduced. This can reduce noise otherwise generated as a result of a high slew rate, and, moreover, can avoid sudden and inconsistent highs (e.g., peaks) in noise that is generated due to the changes being made at any particular slew rate.

It should be noted that although acoustic noise is drastically reduced in certain example embodiments related to the slice selection gradient, some noise still exists due to transitions in other gradients. The actual reduction in acoustic noise achieved in embodiments may differ based on which of the gradient coils is selected for applying the slice selection gradient. There may be different acoustic signatures of different gradient coils. For example, as the sequence changes between greater and lesser amplitudes in Gx, Gy and Gz currents, noise levels may change due to different physical structure, location and/or other mechanical environment aspects of these different coils. The most noise reduction may be achieved when the gradient with the highest acoustic noise signature is selected as the slice select gradient.

Figure 3:
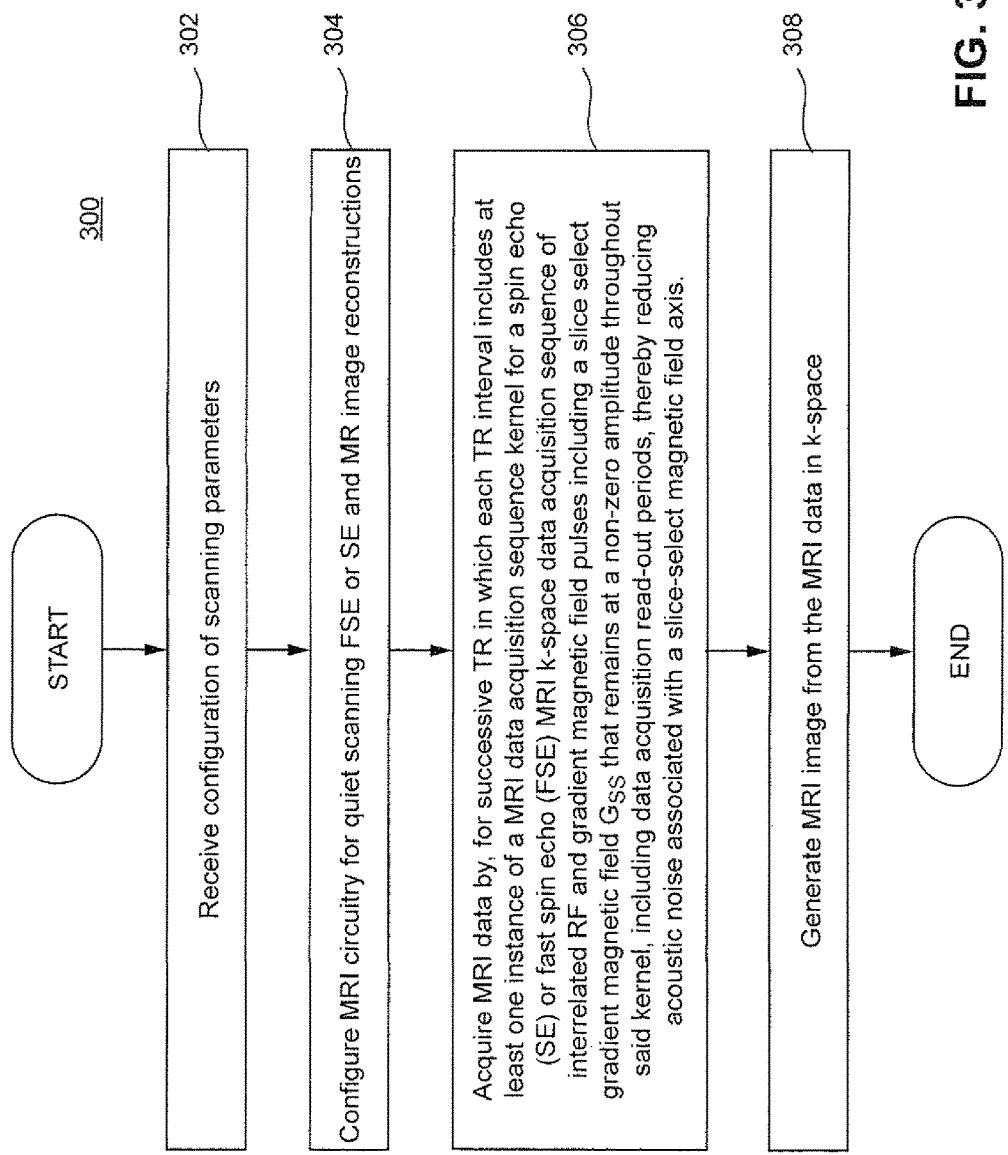
FIG. 3 illustrates a flowchart of a process for MRI scanning with reduced acoustic noise with SE or FSE and MR image reconstruction, in accordance with one or more embodiments.

FIG. 3 illustrates a flowchart of a process 300 for quiet acquisition of MRI data, and reconstruction of MR images. In embodiments, operations 302-304 may be performed earlier in a preparation routine. Operation 308 may be performed subsequently in another routine (perhaps at a remote location) based on acquired and stored MR image data.

At operation 302, after process 300 is entered, an MRI system obtains configuration parameters for quiet scanning and reconstruction in accordance with one or more embodiments. Configuration parameters can include the TR interval length, echo spacing interval and number of echoes, RF excite pulse angle and shape, RF refocus pulse angle and shape, slice selection gradient amplitude, length of gradient transitions for each gradient coil, slew rate, etc. The length of gradient transitions (e.g., 1-2 milliseconds) and slew rate (e.g., 5-10 mT/m/ms milliTesla per meter per millisecond), for example, can have a direct effect on the amount of acoustic noise. At a slew rate of approximately 5-10 mT/m/ms the scanning is quieter than most conventional techniques, but still produces some acoustic noise. For reference, typical conventional parameters include gradient transitions of 0.2-0.6 ms and slew rates of 60-200 mT/m/ms.

At operation 304, the circuits are configured for quiet scanning. Configuring circuits may include configuring according to one or both of preconfigured parameters and/or user provided inputs, and may include configuring one or more of MRI sequence controller 30, the MRI system controller 22, and/or MRI data processor 42. Such configuration may be accomplished by providing suitable executable computer program instructions to the MRI sequence controller 30 which, upon execution of such instructions controls the gradient coil drivers 32 as well as the RF transmitter 34 and in some instances the transmit/receive switch 36.

At operation 306, MRI data is acquired for successive TR intervals while having the slice selection gradient on for data acquisition in addition to having it on for RF excitation. In embodiments, after turning on the slice selection gradient for RF excitation at the beginning of the kernel, the slice select gradient is maintained substantially at the same amplitude after the RF excitation phase throughout the MR data collection using that kernel during a single TR interval. The MRI data acquisition kernel may be a view angle tilting sequence effecting a predetermined view tilting angle (e.g., angle of less than 20 degrees) as defined by $\tan^{-1}$ (amplitude of $G_{SS}$)/(amplitude of $G_{RO}$). Operation 306 is repeated for each TR interval or each occurrence of the kernel in order to acquire sufficient data for k-space in a Cartesian manner. Processing at operation 306 is further described in relation to FIG. 4 below.

At operation 308, an MRI image is reconstructed from the acquired k-space data. According to some embodiments, image reconstruction may be performed directly from the data collected at operation 306. In embodiments in which data is obtained by Cartesian acquisition, no special reconstruction steps may be needed. The reconstructed MR image may be output to a display for diagnostic purposes, transmitted over a network, and/or stored on a digital data storage device.

As those in the art will appreciate, the acquired MRI data may also be stored (locally or remotely) for subsequent image reconstruction.

Figure 4:
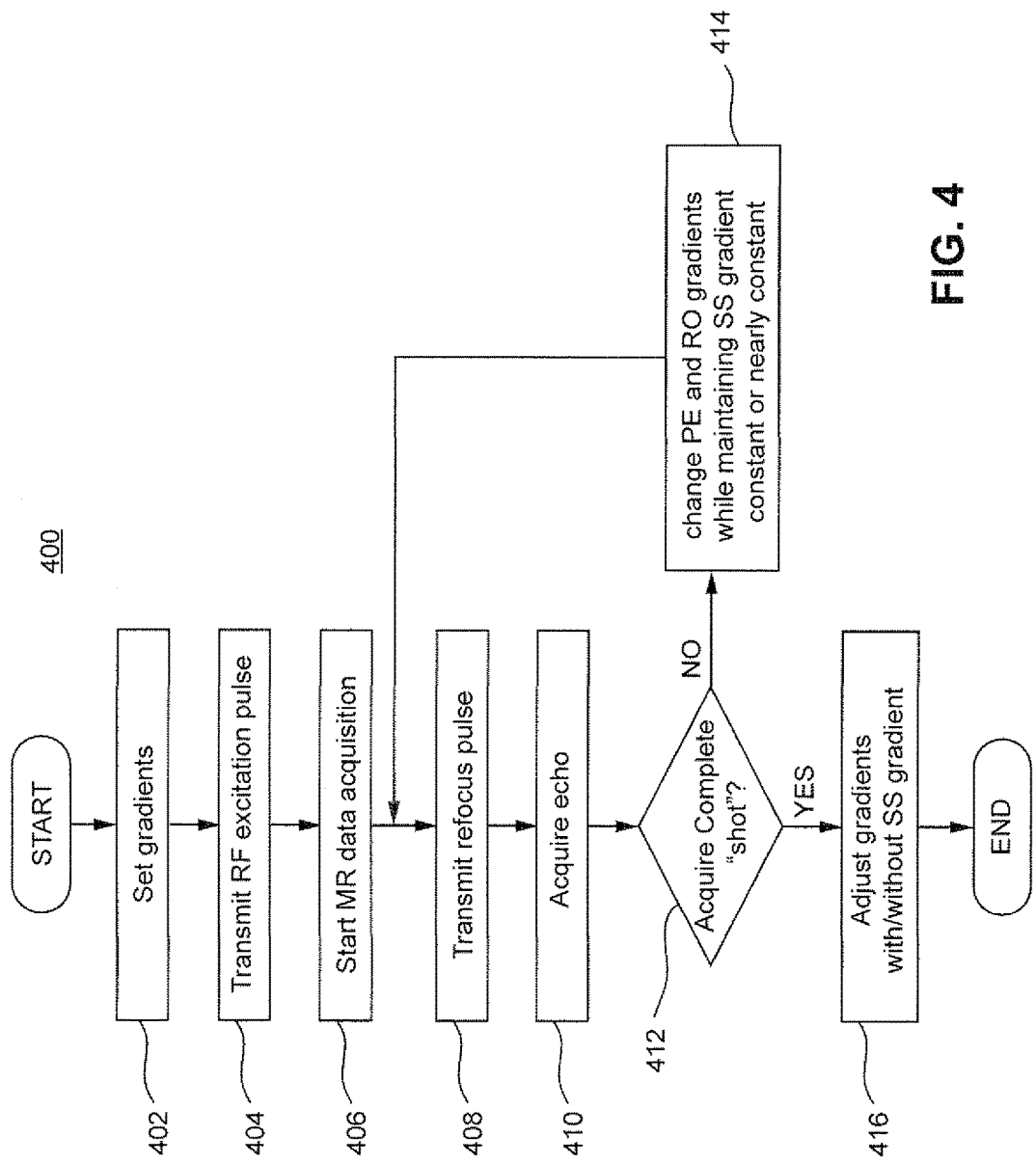
FIG. 4 illustrates a flowchart of a process for configuring gradients and performing related RF excitation and data acquisition, in accordance with one or more embodiments.

FIG. 4 illustrates a flowchart of a process 400 for quiet acquisition of MRI data. In some embodiments, process 400 may be performed to sample k-space during operation 306 of process 300. Process 400 may be repeated to obtain each row in k-space. For example, MR sequence pattern 200 shown in FIG. 2 illustrates a 2D FSE RF pulse sequence 202 and associated gradients for acquiring a single row in k-space in one TR interval. Indeed, other acquisition patterns, such as, for example, SE or 3D FSE, are contemplated as embodiments.

In some embodiments, operations 402-416 may be performed in the order shown or in a different order. One or more operations 402-416 may not be performed in some embodiments, and/or one or more additional operations may be performed in some other embodiments.

After entering process 400, at operation 402, the initial gradients are configured for Gx, Gy and Gz (e.g., readout gradient, phase encode gradient, and slice selection gradient). Gradients configuration may be as shown, for example, in FIG. 2.

At operation 404, an RF excitation pulse is transmitted. The width, envelope shape, phase, etc. of the excitation pulse may be predetermined by, for example, prior configuration. A first TR interval commences upon transmission of the RF excitation pulse.

At operation 406, the MR system is prepared for data acquisition. The MR data acquisition in the example embodiments commences after the RF refocus pulse. The amplitude of the slice select gradient may have been selected to operate as a crusher for FID signal that follows the refocus pulse. Moreover, if necessary, a prewinder may be performed in the readout gradient so that the subsequent data collection can occur at correct portion (e.g. left edge) of a k-space row.

Operations 408-414 are repeated for each RF echo to be acquired, for example, in a 2D FSE acquisition such as that shown in FIG. 2. For example, operations 408-414 may be repeated for each of the 11 RF echoes caused by the 11 successive RF refocus pulses shown in the sequence 202 in FIG. 2.

At operation 408, still in the same TR interval as was begun by the immediately preceding RF excitation pulse, a refocus pulse for causing an RF echo for data acquisition is transmitted.

At operation 410, the corresponding RF echo signal is acquired.

At operation 412, a determination is made whether a complete "shot" has been acquired. That is, it is determined whether more RF refocus pulses remain to be transmitted in order to complete the acquisition of the current shot of k-space.

If it is determined at operation 412 that more RF refocus pulses remain to be transmitted to complete the current "shot", then at operation 414, one or more gradients other than the slice select gradient are adjusted before the next refocusing pulse is transmitted. The slice select gradient remains substantially at the same amplitude and polarity as when the RF excitation pulse was transmitted. After operation 414, the process 400 proceeds to operation 408 to transmit the next RF refocus pulse.

If it is determined at operation 412 that no more RF refocus pulses remain to be transmitted to complete the current "shot", then, all the rows for k-space that is to be acquired in the current "shot" have been acquired. At operation 416, the circuits may be configured for data acquiring in the next TR. In some embodiments, spoilers may be applied to the readout gradient in order to destroy any remaining magnetization. In some embodiments, the slice selection gradient may be slowly transitioned to zero. If data acquisition is to continue for another TR, then the slice select gradient can be ramped up to a predetermined desired amplitude before the next RF excitation pulse is applied.

In some embodiments, the slice select gradient may not be changed between TR intervals. For example, although the embodiments using sequence pattern 200 would turn on and turn off the slice select gradient at the beginning and end of each kernel, some embodiments may, after setting the amplitude and polarity of the slice select gradient before an RF excitation pulse, continue to maintain the same or substantially the same amplitude and polarity of the slice select gradient for more than one TR interval. It will be appreciated that each transition avoided in the slice select gradient will reduce the acoustic noise by some measure. In example embodiments, any configuration ranging from transitioning the slice select gradient after each TR to transitioning the slice select gradient only at the end of the last TR may be practiced with different effect on the reduction of acoustic noise.

After operation 416, process 400 ends.

FIG. 5 shows a table of acoustic noise levels for various arrangements. The orientation column shows axial (AX), sagittal (SG) and coronal (CO) orientation of scanning. The "PE dir" or phase encode direction column lists right-to-left (RL) direction, anterior-posterior (AP) direction and head-foot (HF) direction. The "RO", "PE" and "SS" columns indicate which of the X, Y and Z axis is used for readout, phase encode and slice select, respectively. The right most column indicates the noise standard according to conventional techniques on the left and the noise level achieved by example embodiments on the right. As seen in this table, the acoustic noise reduction is non-uniform across the various arrangements of different orientation and phase encoding directions. This is at least partly due to the different noise contribution made by each of the axes. In general, for each arrangement shown in FIG. 5, the noisiest axes are either the Y axis or the Z axis.

Figure 6:
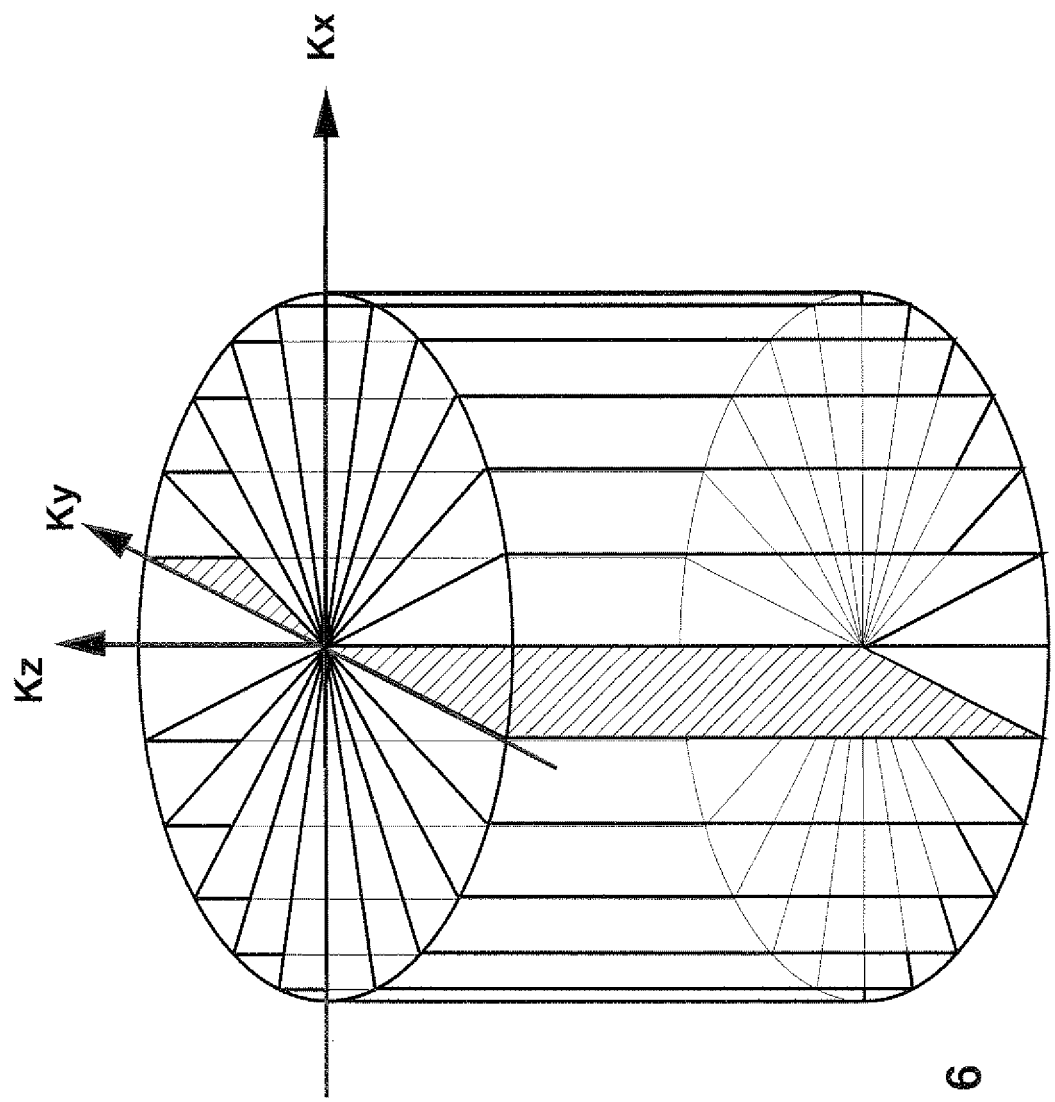
FIG. 6 illustrates a k-space trajectory of data acquisition in 3D FSE, according to some embodiments.

Example embodiments have been described primarily with respect to 2D FSE. However, the techniques described herein are also applicable to 2D SE. The techniques are also applicable to 3D FSE, which is another very frequently used data acquisition sequence in MRI. 3D FSE embodiment requires acquisition of MR data in radial planes. Embodiments may rotate two axes in which the gradient is held to be constant or near constant during a kernel instance. The third axis (with a varying gradient) can be used to effect Cartesian encoding during the echo train and thus yield a "paddle wheel" trajectory in a 3D space as shown in FIG. 6. The paddle wheel trajectory is described in Oshio, "*Whole heart coronary angiography using self-navigated "paddle wheel" balanced SSFP*", Proc. Intl. Soc. Mag. Reson. Med. 13 (2005). In some embodiments, both slice select gradient $G_{SS}$ and readout gradient $G_{RO}$ are maintained at a substantially constant amplitude throughout each kernel instance while phase-encoding magnetic gradient pulses $G_{PE}$ are successively incremented to acquire MRI data for a plane in k-space that is radially re-oriented from time to time in a paddle-wheel fashion of k-space data acquisition by changes in the amplitudes of $G_{SS}$ and/or $G_{RO}$ between at least some kernel instances to acquire 3D MRI data. A radial reconstruction approach can be used to generate an MR image from the data collected in a "paddle wheel" trajectory. In another embodiment, all three axes can be held to constant or near constant gradient for each kernel repetition.

In some embodiments, the 3D FSE implementations can be combined with a technique such as radial FSE (e.g., also known as JET, PROPELLOR, or BLADE) to even further reduce acoustic noise. Radial FSE causes reduced phase encode axis noise because it has lower peak y-axis gradient amplitudes. The 3D FSE combination with radial FSE is more suitable for instances where the tilt angle is low (i.e., the blurring due to view angle shifting is low), for example, below 20 degrees.

The example embodiments described herein, by maintaining a constant or near constant slice selection gradient throughout a kernel of a sequence, retain the susceptibility reduction effects (e.g., metal artifact reduction) of VAT which turns on the slice select gradient for data acquisition. The RF pulse bandwidth can be increased to further reduce susceptibility in the slice direction. However, it should be noted that increasing the RF pulse bandwidth may increase SAR and RF power consumption.

Example embodiments can be configured to tradeoff various attributes in order to achieve embodiments with certain qualities. For example, attributes such as scan time, image quality (e.g., SNR, contrast, blur, etc.), and patient comfort (e.g., acoustic noise) can be traded off to various degrees with each other. Less acoustic noise can be generated in embodiments in exchange for increased blur (caused by the tilt effect) by the use of constant or near constant slice select gradient through data acquisition. The reduction in acoustic noise can be improved at the cost of longer scan times by the use of longer echo spacing. Blur may be reduced at the cost of longer scan times by acquiring increased scan resolution. The selection of an appropriate balance between these tradeoff attributes may be based upon the type of application. For example, whereas acoustic noise reduction would be the primary criteria for pediatric patients, it may be preferable to have improved resolution in orthopedic applications.

Some example embodiments effectively remove acoustic noise from one gradient axis, by removing all or nearly all acoustic noise due to transitions in the slice select gradient. The acoustic noise reduction can be made even more substantial by selecting the loudest axis (for example, between the Z and Y axes) as the slice select axis. Example embodiments achieve better acoustic noise reduction than conventional approaches such as gradient shaping approaches.

Some example embodiments also reduce susceptibility artifacts, while having a substantially lower acoustic noise level than conventional VAT techniques. In contrast to conventional VAT techniques that use high bandwidth RF pulses for susceptibility reduction, some example embodiments may use narrower RF pulse bandwidth that can still achieve some susceptibility reduction while reducing acoustic noise. In many embodiments, acoustic noise reduction is obtained without an increase in the SAR, RF power or magnetization effects when compared to standard FSE techniques. Moreover, many example embodiments which use 2D FSE, have similar TE, echo spacing and TR intervals as conventional 2D FSE, and have similar scan times. No restrictions are imposed in example embodiments on echo spacing (e.g., 7, 10 and 15 ms).

Still further, unlike some conventional techniques for noise reduction, example embodiments have the advantage of not requiring regridding or extra gradient corrections of acquired MR data before reconstruction.

Some example embodiments may cause a slight increase in the minimum TR interval in relation to conventional techniques. This, for example, may be due to the extended ramps on the slice select axis at the beginning and end of each echo train or kernel. However, the extended portions are typically around 5-10 ms and thus impose only a minor cost (e.g., about 5%) in terms of increased TR interval. Some embodiments may also have a total crushing moment that is not equal to a multiple of $\pi$. This may occur because refocus crushers as used in example embodiments are optimized for acoustics rather than for FID crushing. This difference, in some embodiments, can lead to a crusher moment ~33% less than standard crusher moment used in conventional techniques.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:

static and gradient magnetic field generators and at least one radio frequency (RF) coil disposed within said magnetic field generators;

RF transmitter and RF receiver circuits coupled to said at least one RF coil; and at least one MRI sequence control circuit including a k-space memory and at least one processor configured to control said gradient magnetic field generators and said RF transmitter and receiver circuits during execution of an MRI data acquisition sequence including plural successive TR (repetition time) intervals wherein:

said TR intervals each includes at least one instance of a MRI data acquisition sequence kernel for a spin echo (SE) or fast spin echo (FSE) MRI k-space data acquisition sequence of interrelated RF and gradient magnetic field pulses including a slice select gradient magnetic field Gss that remains at a non-zero amplitude throughout said kernel, including data acquisition readout periods, thereby reducing acoustic noise associated with a slice-select magnetic field.

2. The MRI apparatus as in claim 1 wherein the amplitude of said slice select gradient magnetic field Gss remains sufficiently constant to reduce acoustic noise associated with at least one magnetic gradient coil axis by at least 6 dB compared to acoustic noise generated by an MRI data acquisition sequence wherein Gss transitions to substantially zero amplitude between MR echo data acquisition read out periods.

3. The MRI apparatus as in claim 2 wherein the amplitude of said slice select gradient magnetic field does not change by more than 10% between start and finish of a kernel instance.

4. The MRI apparatus as in claim 3 wherein the slice select gradient magnetic field amplitude is ramped up at the starting of a kernel instance and ramped down and at the ending of a kernel instance over a ramp interval of at least about 1 ms to also reduce acoustic noise associated with the slice select gradient magnetic field if its amplitude is ramped up and down at the starting and ending of a kernel instance.

5. The MRI apparatus as in claim 1 wherein the slice select gradient magnetic field axis is an MRI system gradient magnetic field axis that otherwise generates a relatively greater level of acoustic noise, as compared to another MRI system gradient magnetic field axis, during execution of MRI data acquisition sequences.

6. The MRI apparatus as in claim 1 wherein said MRI data acquisition sequence is a view angle tilting sequence effecting a view tilting angle of less than 20 degrees as defined by tan-1 Gss/GRo, Gss being the amplitude of the slice select gradient magnetic field and GRo being the amplitude of a readout gradient magnetic field.

7. The MRI apparatus as in claim 1 wherein a gradient magnetic field orthogonal to said slice select gradient magnetic field axis also remains at a non-zero amplitude throughout said kernel, including data acquisition read-out periods, thereby further reducing acoustic noise associated with another gradient magnetic field axis.

8. The MRI apparatus as in claim 7 wherein both Gss and GRO gradient magnetic fields are maintained at a substantially constant amplitude throughout each kernel instance while phase-encoding magnetic gradient pulses GPE are successively incremented and applied to acquire MRI data for a plane in k-space that is radially re-oriented from time to time in a paddlewheel fashion of k-space data acquisition by changes in the amplitudes of Gss and/or GRO between at least some kernel instances to acquire 3D MRI data.

9. The MRI apparatus as in claim 1 wherein Gss timing as well as any associated crusher amplitude and/or pre-winder effects are designed to maintain substantially constant Gss amplitude throughout each kernel instance.

10. The MRI apparatus as in claim 1 wherein said at least one processor is further configured to shape transitions in amplitude of at least one gradient magnetic field, other than Gss, that is pulsed in amplitude during each kernel instance, so as to further reduce acoustic noise.

11. A method for magnetic resonance imaging (MRI), said method comprising:
controlling MRI gradient magnetic field generators in conjunction with MRI radio frequency (RF) transmitter and receiver circuits during execution of an MRI data acquisition sequence including plural successive TR (repetition time) intervals to execute an MRI data acquisition sequence wherein:
said TR intervals each includes at least one instance of a MRI data acquisition sequence kernel for a spin echo (SE) or fast spin echo (FSE) MRI k-space data acquisition sequence of interrelated RF and gradient magnetic field pulses including a slice select gradient magnetic field Gss that remains at a non-zero amplitude throughout said kernel, including data acquisition readout periods, thereby reducing acoustic noise associated with a slice select gradient magnetic field axis;
acquire MRI data associated with said kernel; and
generate an MRI image from the acquired MRI data.

12. The MRI method as in claim 11 wherein the amplitude of said slice select gradient remains sufficiently constant to reduce acoustic noise associated with at least one magnetic gradient coil axis by at least 6 dB compared to acoustic noise generated by an MRI data acquisition sequence wherein Gss transitions to substantially zero amplitude between MR echo data acquisition read out periods.

13. The MRI method as in claim 12 wherein the amplitude of said slice select gradient does not change by more than 100/0 between start and finish of a kernel instance.

14. The MRI method as in claim 13 wherein the slice select gradient magnetic field amplitude is ramped up at the starting of a kernel instance and ramped down and at the ending of a kernel instance over a ramp interval of at least about 1 ms to also reduce acoustic noise associated with the slice select gradient magnetic field if its amplitude is ramped up and down at the starting and ending of a kernel instance.

15. The MRI method as in claim 11 wherein the slice select gradient magnetic field axis is an MRI system gradient magnetic field axis that otherwise generates a relatively greater level of acoustic noise, as compared to other MRI system gradient magnetic field axes, during execution of MRI data acquisition sequences.

16. The MRI method as in claim 11 wherein said MRI data acquisition sequence is a view angle tilting sequence effecting a view tilting angle of less than 20 degrees as defined by tan-1 Gss/GRo, Gss being the amplitude of the slice select gradient magnetic field and GRo being the amplitude of a readout gradient magnetic field.

17. The MRI method as in claim 11 wherein a gradient magnetic field orthogonal to said slice select gradient magnetic field axis also remains at a non-zero amplitude throughout said kernel, including data acquisition readout periods, thereby further reducing acoustic noise associated with another gradient magnetic field axis.

18. The MRI method as in claim 17 wherein both Gss and GRo gradient magnetic fields are maintained at a substantially constant amplitude throughout each kernel instance while phase-encoding magnetic gradient pulses GPE are successively incremented to acquire MRI data for a plane in kspace that is radially re-oriented from time to time in a paddle-wheel fashion of k-space data acquisition by changes in the amplitudes of Gss and/or GRO between at least some kernel instances to acquire 3D MRI data.

19. The MRI method as in claim 11 wherein Gss timing as well as any associated crusher amplitude and/or pre-winder effects are designed to maintain substantially constant Gss amplitude throughout each kernel instance.

20. The MRI method as in claim 11 further comprising:
shaping of transitions in amplitude of at least one gradient magnetic field, other than Gss, that is pulsed in amplitude during each kernel instance, so as to further reduce acoustic noise.

* * * * *